United States Patent [19]

Oka

[11] Patent Number: 4,476,601

[45] Date of Patent: Oct. 16, 1984

[54] WASHING APPARATUS

[75] Inventor: Masahiko Oka, Hikone, Japan

[73] Assignee: Dainippon Screen Manufacturing Co., Ltd., Kyoto, Japan

[21] Appl. No.: 463,423

[22] Filed: Feb. 3, 1983

[30] Foreign Application Priority Data

Apr. 17, 1982 [JP] Japan ................................. 57-64561

[51] Int. Cl.³ .............................................. A46B 13/02
[52] U.S. Cl. ...................................... 15/21 D; 15/77; 51/105 R
[58] Field of Search ............. 15/4, 21 R, 21 C, 21 D, 15/21 E, 77, 97 R, 102; 51/103 R, 105 R, 106 R, 106 LG, 129, 131.1, 132

[56] References Cited

U.S. PATENT DOCUMENTS 2,156,881  5/1939  Snyder ................................ 15/21 D

FOREIGN PATENT DOCUMENTS 0638324 12/1978  U.S.S.R. .......................... 15/21 E

Primary Examiner—Edward L. Roberts
Attorney, Agent, or Firm—Millen & White

[57] ABSTRACT

A washing apparatus constructed for using a plurality of types of brushes, in a manner such that a brush is supported on an end of a swing lever, and with an object to be washed being washed by rotating the brush in contact with said object. The washing apparatus is characterized so that when a hard brush is used the swing lever is fixed. However when a soft brush is used the brush is constrained by applying to said lever a load which is balanced by, or is a little less than the weight of said brush.

6 Claims, 4 Drawing Figures

WASHING APPARATUS

BACKGROUND OF THE INVENTION

The present invention relates to a washing apparatus having a plurality of operative types of brushes. More particularly, the invention relates to an apparatus for washing semiconductor slices (wafers) and the like by using separately, for example, a nylon brush having hard "hairs" or stalks and a mohair brush having soft hairs.

Generally, wafers at the water process manufacturing stage, e.g., at the stage where they have just been sliced from a monocrystal silicon rod, are vigorously washed by a hard brush such as nylon brush with the distance between said brush and the wafer kept constant. On the other hand, at the stage where integrated circuits have been built into the wafers, they are gently washed by a soft brush such as mohair in such a manner that the brush is in contact with the wafer with a constant weight, (tens to hundreds of grams), applied to the brush while exercising care not to damage the integrated circuits.

Such, a conventional washing apparatus is shown in FIG. 1. In this figure, there are installed side by side a washing tank 3 for a wafer 2 used for initial washing of wafers and having a spin chuck in the middle, and a brush washing tank 5 which receives a nylon brush 1 therein when the wafer 2 is not being washed. In the brush washing tank 5, the brush 1 is washed with pure water spouting from a shower pipe 4. When the wafer 2 is handled and held on the spin chuck by suction, an air cylinder 8 is operated to advance a rack 9 interlocked to a pinion 7, so that a swing lever 1" fixed at one end to said pinion 7, and at the other end to a bearing supporting said brush 1, transfers the brush 1 onto the wafer 2. The wafer 2 is rotated by the spin chuck, while the brush 1 is rotated by a motor (not shown) through a belt 6. In this case, the brush 1 is forced into contact with the wafer 2 and the latter is washed as a result of the springback force of the hairs of the brush 1. The pressing force on the brush 1 is obtained by contacting the brush 1 and wafer 2 with each other when the air cylinder 8 is at the stroke end and hence when the brush 1 is at a certain level somewhat below its highest level.

Next, for the washing of the wafer 2 in the stage wherein integrated circuits have been built thereinto, in said apparatus the nylon brush 1 is replaced by a softhair mohair brush 1, and the wafer having the integrated circuit is washed in the same manner as before. In this case, the pressing force on the brush 1 is obtained by applying a load of tens to hundreds of grams to the brush, but it may be obtained by bringing the brush 1 and wafer 2 into contact with each other at a certain level somewhat below its highest level when the air cylinder is at the stroke end, as in the preceding case. However, as a result of this operation distance between the brush 1 and the wafer 2 is always constant so that even if the brush 1 uses a soft material there is a drawback that there is no play in the brush position, thus making gentle washing impossible.

Accordingly, the present invention has as an object to eliminate the drawback of the prior art and is intended to improve on the conventional washing apparatus and to provide a washing apparatus capable of using a plurality of types of brushes each in its optimum operational condition.

DESCRIPTION OF THE INVENTION

Figure 1:
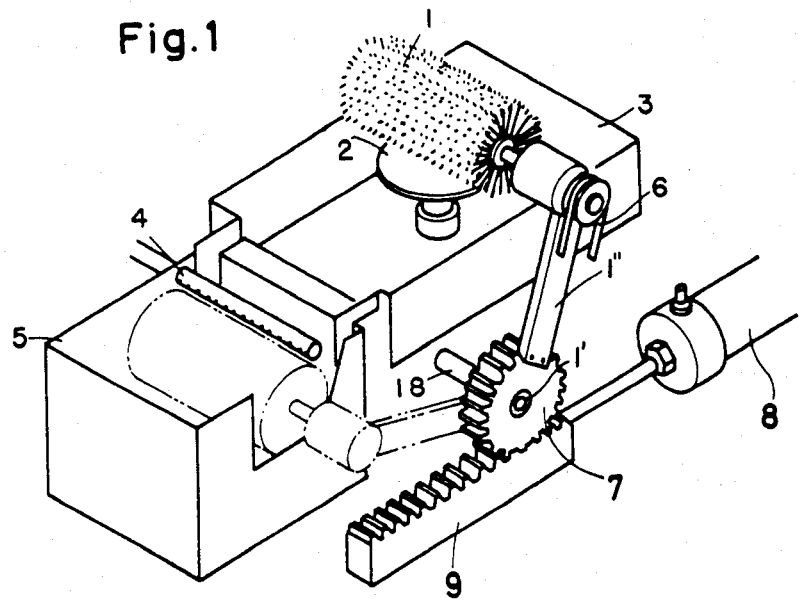
FIG. 1 is a perspective view of a conventional washing apparatus as discussed above.
Figure 2:
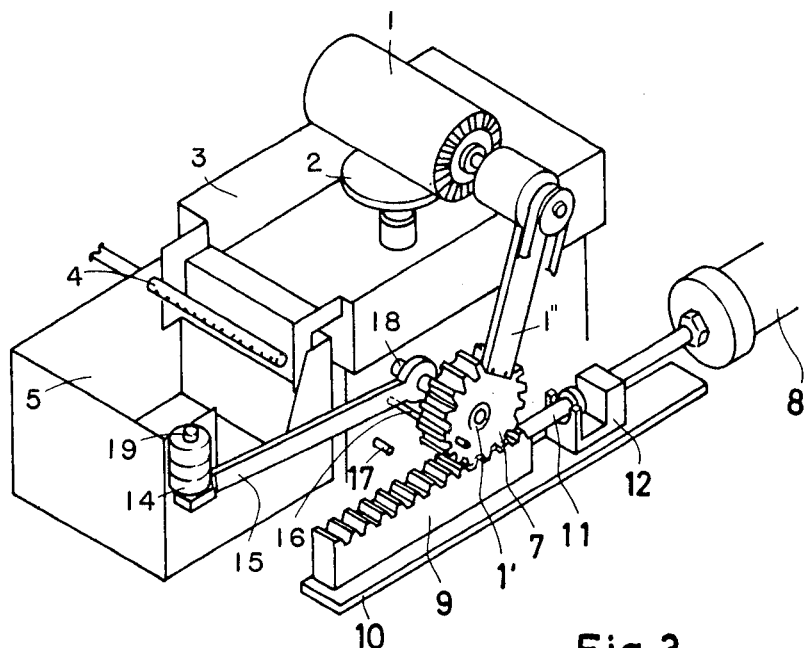
FIG. 2 is a perspective view of a washing apparatus according to an embodiment of the invention.

One embodiment of the present invention will now be described with reference to the accompanying drawings. FIG. 2 is a perspective view, wherein the parts which are the same as or equivalent to those in FIG. 1 are indicated by the same reference numerals.

In FIG. 2, the pinion 7 is supported on a shaft 18 through a bearing 1', and one end of a weight attaching lever 15 is loosely fitted on the pinion-supporting shaft 18 between the machine frame and the pinion 7. The other end of the weight attaching lever 15 has a weight attaching pin 19 set thereinto, on which a plurality of weights 14 can be fitted.

Figure 3:
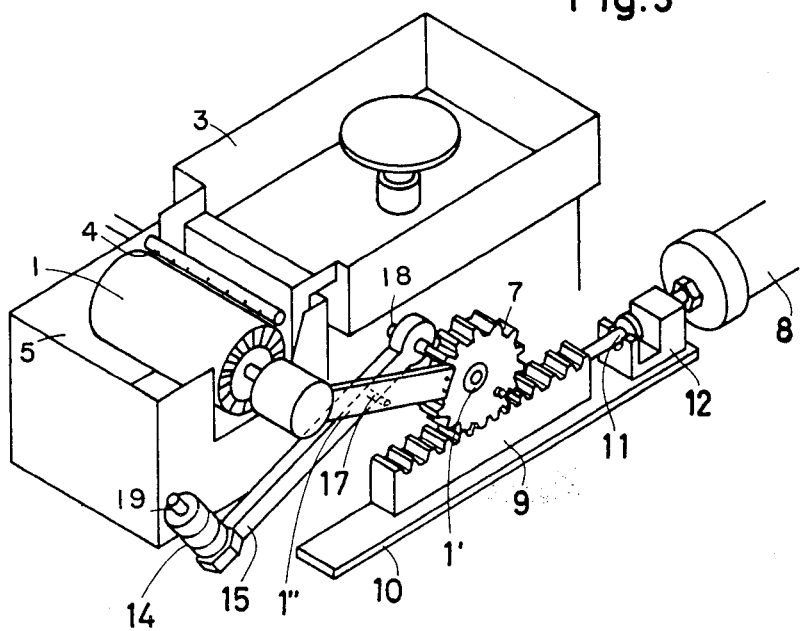
FIG. 3 is a perspective view of the embodiment of FIG. 2 showing a brush being washed.

When the brush 1 is placed in the brush washing tank 5 (see FIG. 3), the weight attaching lever 15 is turned downwardly around the axis of the shaft 18 under the gravity exerted on the weights 14 until it abuts against a stop 17 fixed to the machine frame, whereby it is stopped. When the wafer 2 is placed on and sucked onto the spin chuck, the air cylinder 8 is actuated to extend its rod. The rod is provided at its front end with a hook 12 which is engaged with an arrest pin 11 in such a manner that there is some play therebetween. Therefore, when the rack 9 is caused to slide as the rod is extended, the pinion 7 is rotated and before the brush 1 comes in contact with the wafer 2, the pin 16 projecting from the lateral surface of the pinion 7 raises the weight attaching lever 15 together with the weights 14, whereby they become interconnected with the brush 1 and swing lever 1".

The operation of the apparatus will now be described. Since the arrest pin 11 and hook 12 are engaged with each other with some play therebetween, at the stroke end where the air cylinder 8 has thoroughly pushed the hook 12 forward, the weight of the brush 1 and swing lever 1" causes the rack 9 meshing with the pinion 7 to slide on a slide block 10, with the arrest pin 11 stopping approximately at the middle of the range of play in the hook 12. As a result, in the case of using the soft-hair mohair brush 1, a load which is equal to the total weight of the brush 1 and swing lever 1" minus the gravity of the weights 14 acts on the wafer while the wafer 2 is rotated to wash the brush 1 which is being rotated by the spin chuck.

Since the lower surface of the rack 9 slides on the swing block 10 made of Teflon or the like, the rack 9 exerts almost no force on the pinion 7. Furthermore, the load on the brush 1 can be adjusted by changing the number of weights 14 on the weight attaching pin 19.

Figure 4:
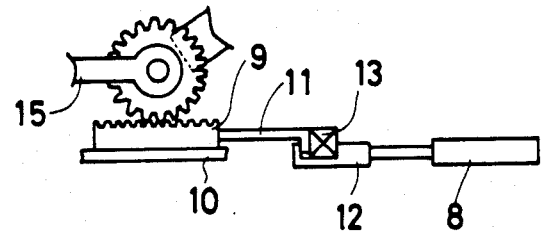
FIG. 4 is a fragmentary side view wherein a nylon brush is used in the embodiment of FIG. 3.

When the hard-hair nylon brush 1 is used in this apparatus, as is shown in FIG. 4, a fixing block 13 is placed between the arrest pin 11 and the hook 12, thereby forcing the brush 1 into contact with the wafer 2 at the stroke end of the cylinder 8; and in this manner it is washed.

In the above embodiment, the weight attaching pin 19 is set into the end of the weight attaching lever 15 and a plurality of weights (several grams) are fitted on said pin. However, the end of the weight attaching lever 15 may be constantly pulled downwardly by a spring which is adjustable by a screw. Alternatively, the end of the weight attaching lever 15 may be threaded to threadingly receive a suitable number of weights 14, and the position of the weight attaching lever 15 in the direction of the shaft 18 may be finely adjusted.

In brief, the present invention provides a washing apparatus capable of using a plurality of types of different brushes, with a brush supported on the end of a swing lever and with an object of washing being washed by rotating the brush in contact with said object. The washing apparatus is characterized in that when a hard brush is used the swing lever is fixed, but when a soft brush is used the brush is constrained by applying to the swing lever a load which is balanced by the weight of the brush. Thus, dissimilar brushes can be used in the single washing apparatus to different effects. More particularly, when a hard brush is used, the object can be washed in such a manner that the swing lever is fixed and the hard brush is pressed against the object, while when a soft brush is used the object can be washed in such a manner than a desired amount of load is applied to the swing lever and the load is balanced by the weight of the brush while allowing the swing lever to swing, with the soft brush being in contact with the object. Thus, the load can be changed according to the nature of the soft brush and the object can be washed under a contact pressure suitable for the object.

In addition, if the object of washing is a wafer, washing of the water can be effectively attained.

What is claimed is:

1. In an apparatus for washing silicon wafer type articles, said apparatus comprising a chuck for supporting said article to be washed thereon, a rotary brush having a weight and movable between a first operational position in which said brush is forced against said article, and a second inoperative position in which said brush is spaced from said article, and moving means for alternately moving said brush between said first operational position and said second inoperative position, the improvement wherein, said means for alternately placing said brush between said first operational and second inoperative positions comprises in combination, an elongated arm pivotally attached to a stationary base at one end thereof, said brush being rotatably attached to and laterally extending from the other free end of said arm; adjustable weight means associated with said arm for counteracting the weight of said brush through said arm to reduce the amount of pressure exerted by said brush due to the weight upon said article and to permit said brush to repeatedly rebound on said article when the brush is in operation in said first operational position; and operation selecting means for selectively holding said brush fixed in said operational position and for selectively disabling said counter-acting weight means to force said brush against said article at a constant pressure.

2. An apparatus as in claim 1, wherein said chuck is rotatable about is own axis of rotation.

3. An apparatus as in claim 2, wherein said arm has at said one end a pinion meshing with a slidable rack with said slidable rack being actuatable by a pneumatic cylinder, and said pinion being mounted on a shaft extending from said stationary base for effecting the pivotal movement of said arm.

4. An apparatus as in claim 3, wherein said counteracting weight means comprises a weight attaching lever secured to said shaft and radially extending therefrom in a manner defining an angle relative to said arm.

5. An apparatus as in claim 4, wherein said operation selecting means for selectively holding said brush in said first operational position comprises means for connecting and alternatively disconnecting said rack to said pneumatic cylinder when said brush is placed in said first operational position.

6. An apparatus as in claim 5, wherein, when said brush is in said first operational position, said weight attaching lever is connected in a manner defining an acute angle relative to a horizontal plane including said shaft to which the lever is secured, and said arm defines an obtuse angle including said acute angle relative to said horizontal plane.

* * * * *